United States Patent [19]
Hsu

[11] Patent Number: 6,143,595
[45] Date of Patent: Nov. 7, 2000

[54] METHOD FOR FORMING BURIED CONTACT

[75] Inventor: Shih-Ying Hsu, Hsinchu, Taiwan

[73] Assignee: United Microelectronics Corp., Hsinchu, Taiwan

[21] Appl. No.: 09/348,374

[22] Filed: Jul. 7, 1999

[51] Int. Cl.[7] .................................................. H01L 21/74
[52] U.S. Cl. ......................... 438/221; 438/233; 438/430; 438/666
[58] Field of Search .................................. 438/233, 221, 438/296, 430, 533, 666, FOR 196

[56] References Cited

U.S. PATENT DOCUMENTS 5,904,531  5/1999  Liaw .
5,930,633  7/1999  Liaw .
5,972,759  10/1999  Liaw .

*Primary Examiner*—George Fourson
*Assistant Examiner*—Joannie A. Garcia
*Attorney, Agent, or Firm*—Thomas, Kayden, Horstemeyer & Risley

[57] ABSTRACT

A method of forming a buried contact. A substrate has an oxide layer and a first conductive layer thereon, and an isolation region is formed in the first conductive layer, the oxide layer and the substrate. A patterned first mask layer with an opening is formed over the substrate. A portion of the isolation region and a portion of the first conductive layer are exposed. An ion implantation process is performed to form a buried contact within the substrate, and then the portion of the isolation region exposed by the opening is removed to form a trench in the isolation region. The patterned mask layer is removed, and next a second conductive layer is formed over the substrate and fills the trench. The second conductive layer and the first conductive layer are patterned to form a conductive wire and a gate, wherein the conductive wire electrically connects with the buried contact.

14 Claims, 8 Drawing Sheets

METHOD FOR FORMING BURIED CONTACT

BACKGROUND OF THE INVENTION

1. Field of the Invention

The present invention relates to a method for forming a semiconductor device. More particularly, the present invention relates to a method for forming a buried contact (AC).

2. Description of the Related Art

In the current art, a polysilicon layer makes contact with a single crystal silicon substrate via a buried contact as integration of a semiconductor device increases. However, the conventional method of forming the buried contact causes some drawbacks.

FIGS. 1A through 1D are schematic, cross-sectional views showing the progression of conventional manufacturing steps for a buried contact.

As shown in Fig. 1A, a gate oxide layer 104 and a polysilicon layer 106 are formed in sequence on a substrate 100 having an insulating region 102 formed therein. A photoresist layer 108 for forming a buried contact is formed on the polysilicon layer 106; the polysilicon layer 106 and the gate oxide layer 104 are patterned to expose the substrate 100 by plasma etching. Then, an ion implantation step 109 is performed to form a buried contact 110 in the substrate 100.

As shown in Fig. 11B, the photoresist layer 108 is removed. A polysilicon layer 112 is formed over the substrate 100 and couples with the buried contact 110. Then, a photoresist layer 114 is formed on the polysilicon layer 112. Photoresist layer 114 is subsequently for defining a gate and a conductive wire coupled with the buried contact 110. An edge 134 of the photoresist layer 114 is precisely aligned over an edge 136 of the buried contact 110.

As shown in Fig. 1C, a portion of the polysilicon layer 112 and a portion of the polysilicon layer 106 are removed by a plasma etching process to form a gate 116 and a conductive wire 118 coupled with the buried contact 110; the gate oxide layer 104 serves as an etching stop layer during the plasma etching process. Furthermore, the gate oxide layer 104 also serves as a protective layer to protect the substrate 100 from damage during the plasma etching process. Next, an ion implantation step 120 is performed to form a lightly doped source/drain region (LDD) 122 in the substrate 100.

As shown in Fig. 1D, spacers 124 and 126 are formed on sidewalls of the gate 116 and sidewalls of the conductive wire 118, respectively. An ion implantation step 128 is then performed to form a heavily doped source/drain region 130 in the substrate 100 while using the gate 116, the spacer 124, the spacer 126 and the conductive wire 118 as a mask. The lightly doped source/drain region 122 and the heavily doped source/drain region 130 constitute a source/drain region 132, and the source/drain region 132 connects to the buried contact 110.

In the method mentioned above, the source/drain region 132 is electrically connected with the conductive wire 118 through the buried contact 110. To form this structure, the edge 134 of the photoresist layer 114 (FIG. 1B) must be precisely aligned over the edge 136 of the buried contact 110 (Fig. 1B). Once misalignment occurs, electrical discontinuity between the buried contact 110 and the source/drain region 132 occurs.

The following shows the problems caused by misalignment. FIGS. 2A through 2B are schematic, cross-sectional views of what happens due to a positive offset while aligning the edge of the photoresist layer over the edge of the buried contact. FIGS. 3A through 3B are schematic, cross-sectional views of what happens due to a negative offset while aligning the edge of the photoresist layer over the edge of the buried contact.

As shown in FIG. 2A, during the process of forming the gate 116 and the conductive wire 118, an edge 134a of the photoresist layer 114 is located in a range 142 due to a positive offset, i.e., misalignment occurs. Thus, a portion of the polysilicon layer 112 on the buried contact 110 is exposed. Since no gate oxide layer 104 exists between the portion of the polysilicon layer 112 on the buried contact 110 and the substrate 100, a micro-trench 140, as illustrated in FIG. 2B, is easily formed within the buried contact 110 while performing the plasma etching process, and the subsequently formed spacer 126 fills the micro-trench 140. Electrical continuity between the buried contact 110 and the source/drain region 132 is affected by the spacer 126 in the micro-trench 140. In particular, when the micro-trench 140 is deeper than the buried contact 110 as shown in FIG. 2B, the source/drain region 132 cannot electrically couple with the buried contact 110, so the buried contact 110 fails.

Referring to FIG. 3A, a position of an edge 134b of the photoresist layer 114 exceeds the range 142 because of a negative offset. After the gate 116 and the conductive wire 118 are formed, the conductive wire 118 not only covers the buried contact 110, but also covers a portion of the substrate 100. As a result, the source/drain region 132 formed while using the gate 116, the spacer 124, the spacer 126 and the conductive wire 118 as a mask is not adjacent to the buried contact 110 as shown in FIG. 3B. Electrical dis-continuity between the buried contact 110 and the source/drain region 132 occurs, so the buried contact 110 fails.

According to the above statements, some disadvantages are caused by misalignment in the process for forming the buried contact. Because of a positive offset, a micro-trench is easily formed within the buried contact and the source/drain region therefore cannot couple with the buried contact. Due to a negative offset, the source/drain region is not formed adjacent to the buried contact, and thus electrical discontinuity between the buried contact and the source/drain region occurs. Although these disadvantages can be overcome by optimizing the process, the method of optimizing the process reduces the process window. As a result, the process becomes difficult and throughput of the process is also decreased.

SUMMARY OF THE INVENTION

The invention provides a method for forming a buried contact. This invention widens the process window of the process for forming the buried contact, and thus the process is easily performed. Additionally, the throughput of the process is also increased due to the wide process window.

To achieve these and other advantages and in accordance with the object of the present invention, as embodied and broadly described herein, this invention provides a method for forming a buried contact. The method for fabricating a buried contact includes the following steps. A substrate with an oxide layer and a first conductive layer thereon is provided, and an isolation region is formed in the first conductive layer, the oxide layer and the substrate. A patterned mask layer with an opening is formed over the substrate; a portion of the isolation region and a portion of the first conductive layer are exposed. An ion implantation process is performed to form a buried contact within the substrate, and then the portion of the isolation region exposed by the opening is removed to form a trench in the isolation region. The patterned mask layer is removed, and next a second conductive layer is formed over the substrate and fills the trench. The second conductive layer and the first conductive layer are patterned to form a conductive wire and a gate, wherein the conductive wire electrically connects with the buried contact.

The process of patterning the first conductive layer and the second conductive layer to form the conductive wire and the gate includes the following steps. A patterned photoresist layer for defining the conductive wire and the gate is formed over the substrate, and then an etching process is performed. The edge of the photoresist layer is need not be precisely aligned over the edge of the buried contact and only needs to be located within the range of the buried contact. Therefore, the process window of the process is widened. As a result, the process is easy to perform, and the throughput of the process is increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
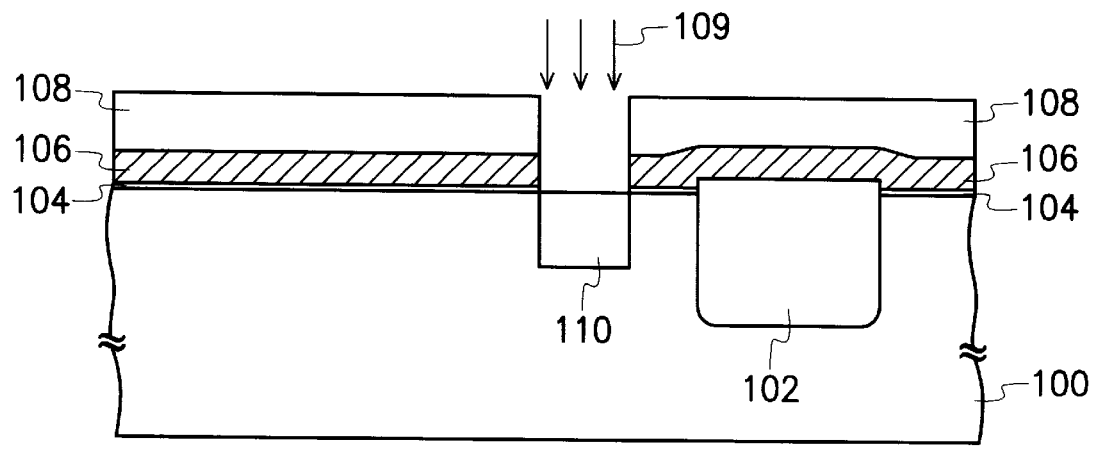
Fig. 1A through 1D are schematic, cross-sectional views showing the progression of conventional manufacturing steps for a buried contact.
Figure 1B:
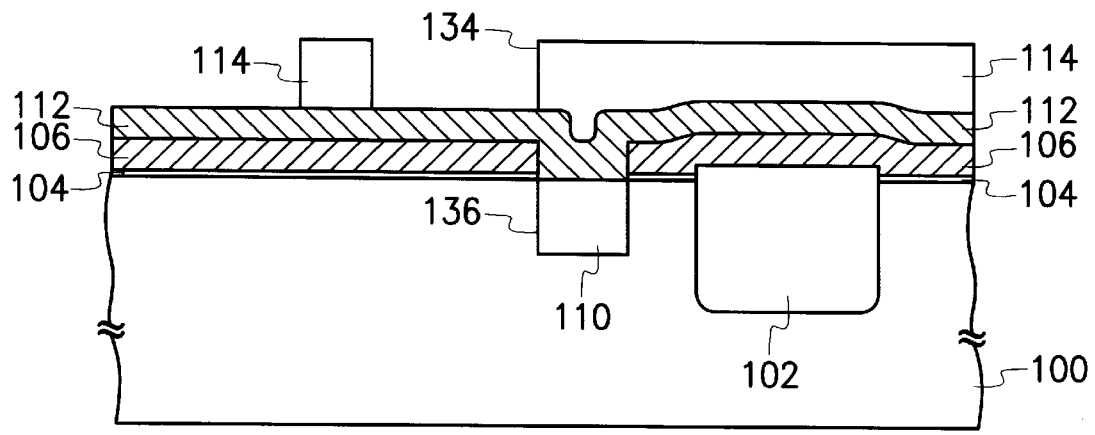
Figure 1C:
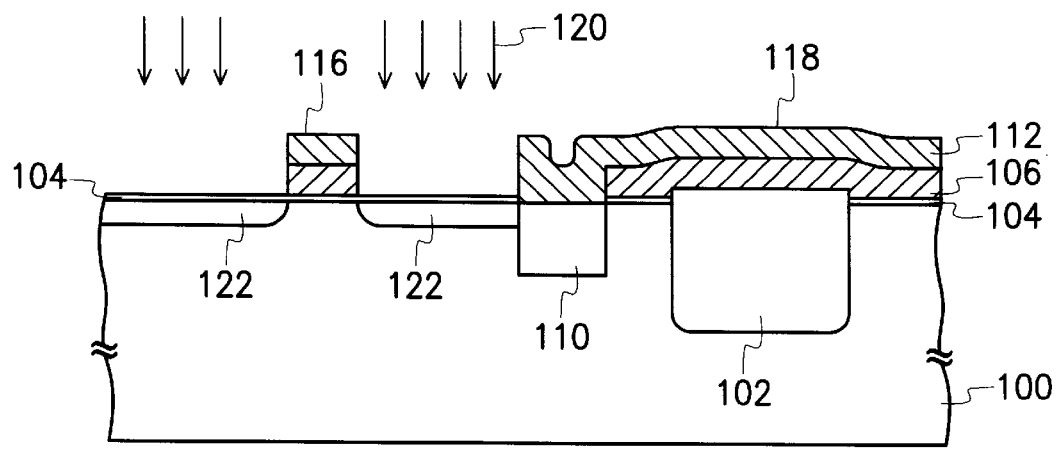
Figure 1D:
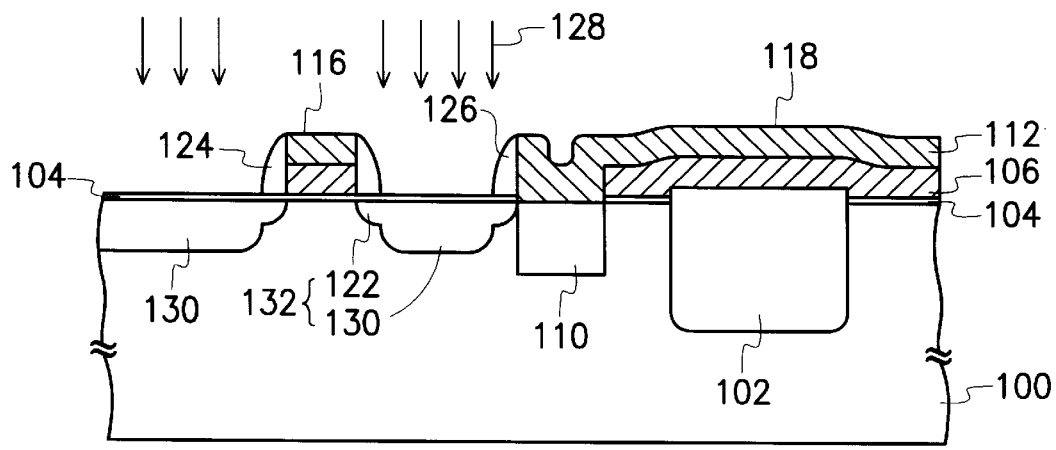
Figure 2A:
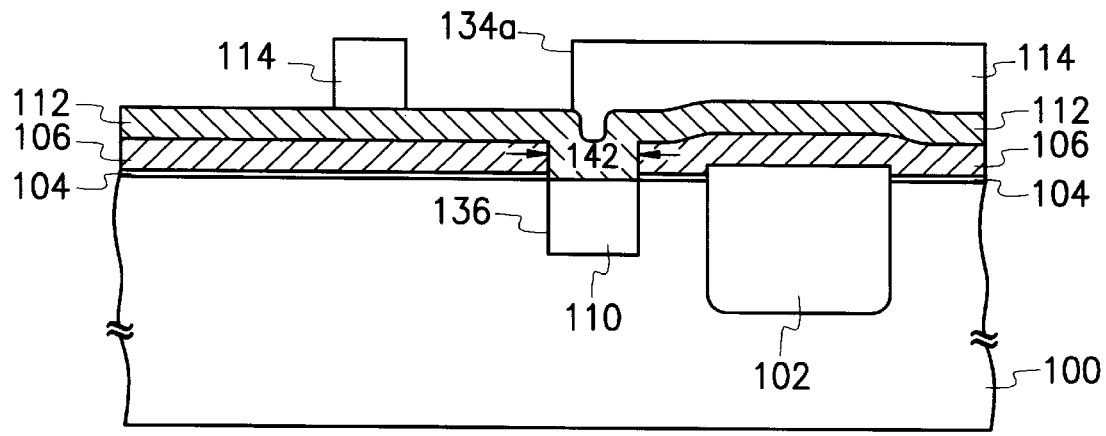
Fig. 2A through 2B are schematic, cross-sectional views of what happens due to a positive offset while aligning the edge of the photoresist layer with the edge of the buried contact.
Figure 2B:
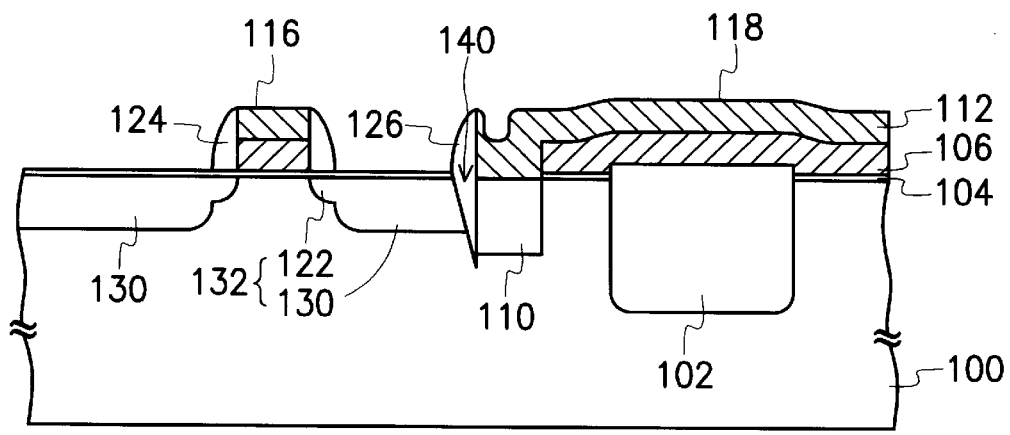
Figure 3A:
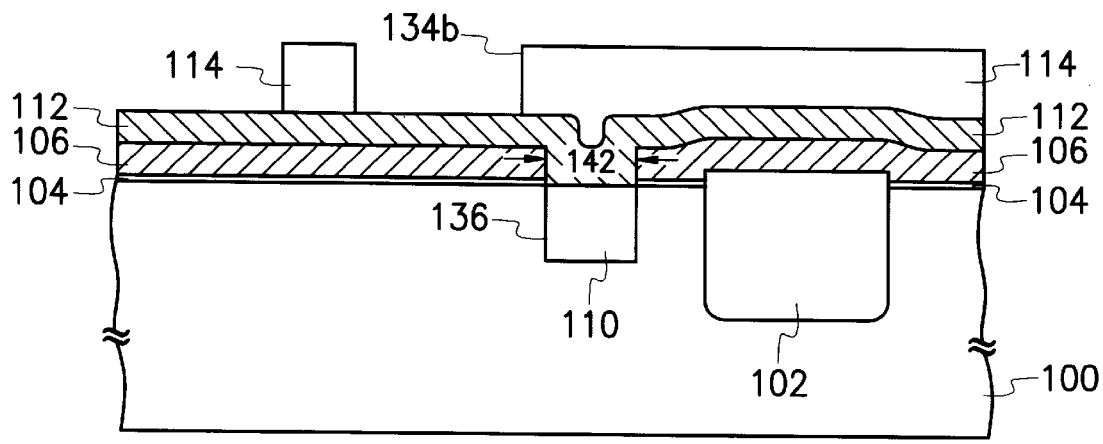
FIGS. 3A through 3B are schematic, cross-sectional views of what happens due to a negative offset while aligning the edge of the photoresist layer with the edge of the buried contact.
Figure 3B:
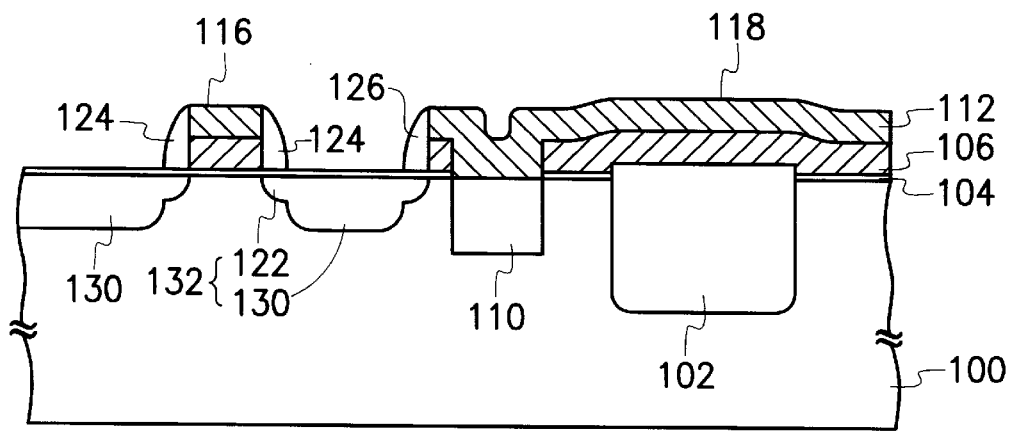

Reference will now be made in detail to the present preferred embodiments of the invention, examples of which are illustrated in the accompanying drawings. Wherever possible, the same reference numbers are used in the drawings and the description to refer to the same or like parts.

FIGS. 4A through 4I are schematic, cross-sectional views showing the progression of steps when fabricating a buried contact according to one preferred embodiment of this invention.

Figure 4A:
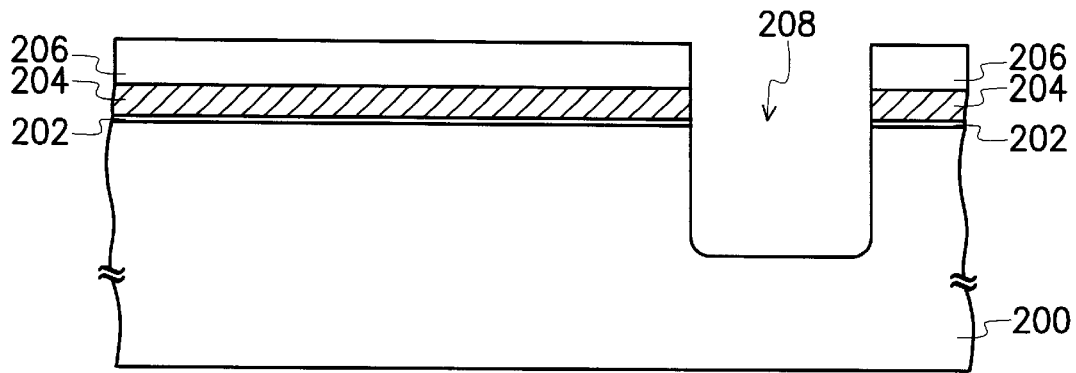
FIGS. 4A through 4I are schematic, cross-sectional views showing the progression of steps when fabricating a buried contact according to one preferred embodiment of this invention.

As shown in FIG. 4A, an oxide layer 202, a conductive layer 204 and a mask layer 206 are formed on a substrate 200 in sequence. The oxide layer 202 is formed, for example, by thermal oxidation at about 800–1000° C., and the thickness of the oxide layer 202 is about 30–200Å. The conductive layer 204, whose thickness is about 500–2500Å, is preferably formed, for example, by chemical vapor deposition and the conductive layer 204 is made of a material such as doped polysilicon or metal, wherein the metal includes aluminum, copper or tungsten. The mask layer 206 is formed from a material such as silicon nitride by, for example, chemical vapor deposition. Then, the mask layer 206, the conductive layer 204 and the oxide layer 202 are patterned to form a trench 208 in the substrate 200.

Figure 4B:
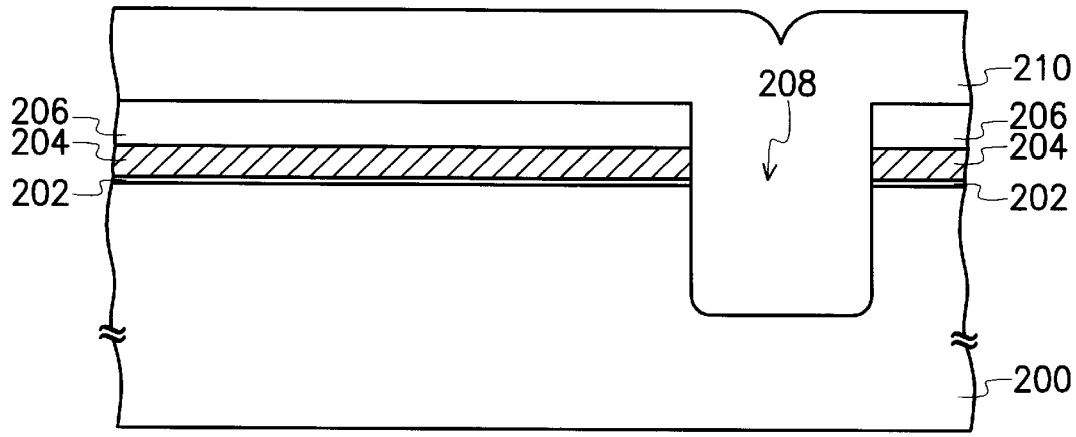

As shown in FIG. 4B, an insulating layer 210 such as silicon oxide is formed on the mask layer 206 by, for example, chemical vapor deposition with tetra-ethyl-orthosilicate (TEOS) as a gas source and fills the trench 208. Preferably, a densification process such as an annealing process is performed after forming the insulating layer 210.

Figure 4C:
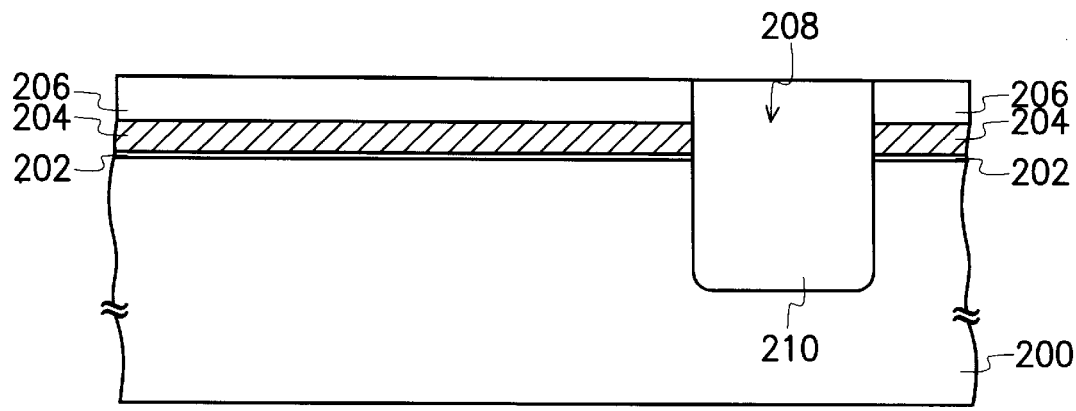

As shown in FIG. 4C, a portion of the insulating layer 210 is removed by, for example, chemical mechanical polishing to expose the mask layer 206. The remaining insulating layer 210 within the trench 208 is used as an isolation structure. The method of forming the insulating layer 210 within the trench 208 is not restricted to that illustrated in FIGS. 4A through 4C; other insulating layer as are known in the art are also suitable.

Figure 4D:
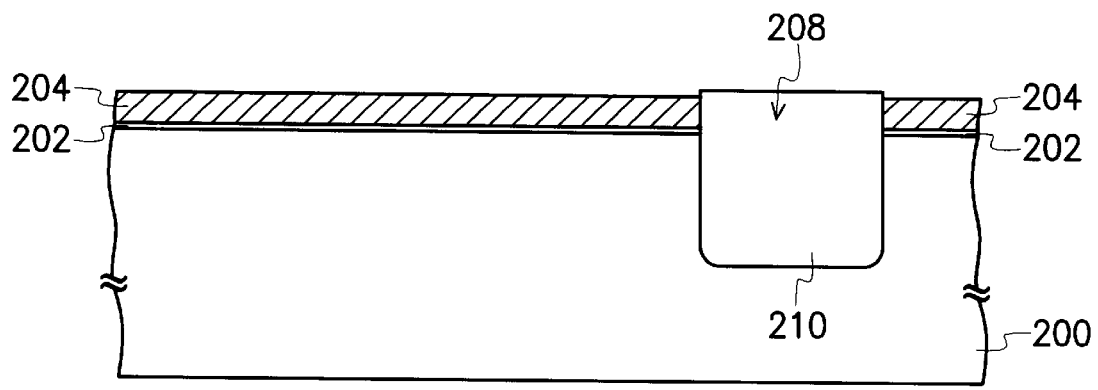

As shown in FIG. 4D, the mask layer 206 is removed by, for example, wet etching to expose the conductive layer 204, and an etchant used in the wet etching process is preferably phosphoric acid. Moreover, a portion of the insulating layer 210 is also removed; thus, the remaining insulating layer 210 is about level with the conductive layer 204.

Figure 4E:
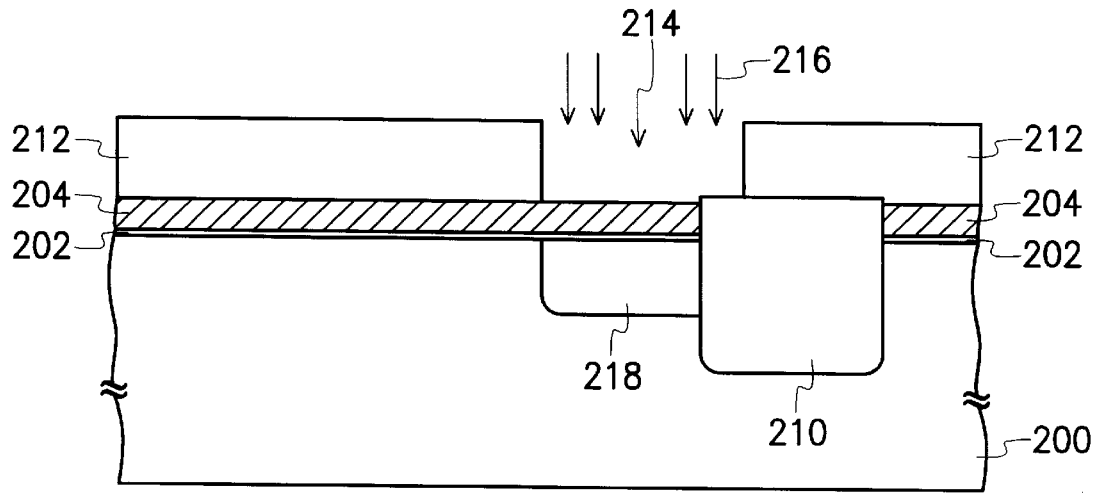

As shown in FIG. 4E, a mask layer 212 with an opening 214 is formed over the substrate 200, and a portion of the conductive layer 204 and a portion of the insulating layer 210 are exposed by the opening 214. The mask layer 212 is made of a material such as a photoresist. An ion implantation step 216 is performed to form a buried contact 218 in the substrate 200 while using the mask layer 212 as a mask, such that the buried contact 218 is adjacent to the insulating layer 210.

Figure 4F:
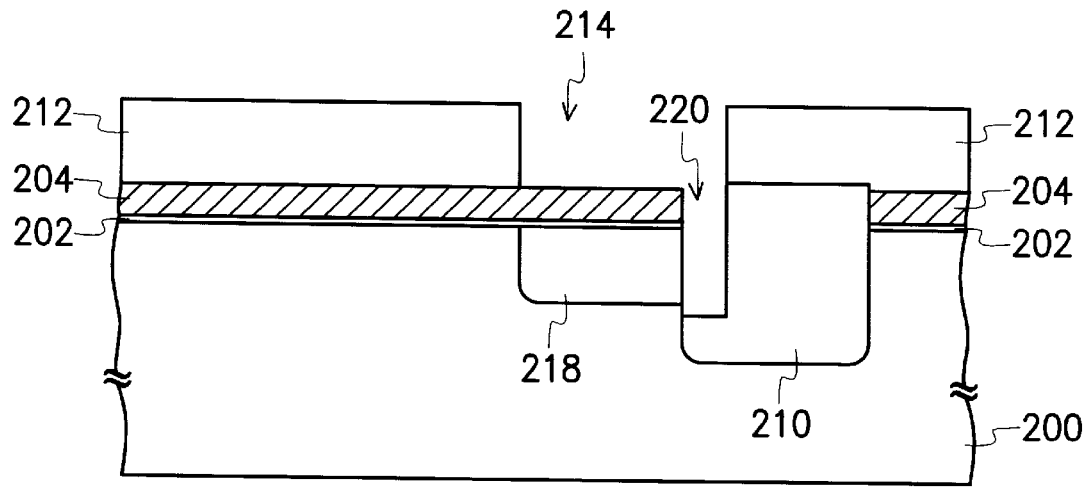

As shown in FIG. 4F, the portion of the insulating layer 210 exposed by the opening 214 is removed to form a trench 220 within the insulating layer 210 by, for example, dry etching with the mask layer 212 and the portion of the conductive layer 204 exposed by the opening 214 serving as a mask.

Figure 4G:
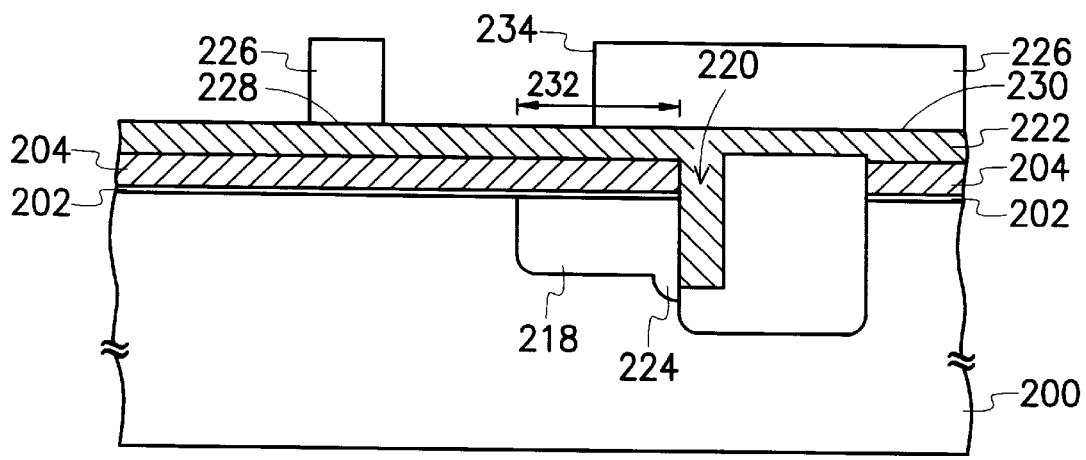

As shown in FIG. 4G, the mask layer 212 is removed, and then a conductive layer 222 is formed over the substrate 200 by, for example, chemical vapor deposition and fills the trench 220. The conductive layer 222 is made of a material such as doped polysilicon, silicide or metal, wherein the metal includes aluminum, copper or tungsten. Preferably, the thickness of the conductive layer 222 is about 500–2500Å. If the conductive layer 222 is made of doped polysilicon, dopants of the conductive layer 222 may diffuse into the substrate 200 to form a diffusion region 224. The diffusion region 224 can be regarded as a part of the buried contact 218. By filling the trench 220 with the conductive layer 222, the conductive layer 204 couples with the buried contact 218.

A mask layer 226 covering a region 228 predetermined for forming a gate and a region 230 predetermined for forming a conductive wire is formed on the conductive layer 222. The mask layer 226 is made of a material such as photoresist. An edge 234 of the mask layer 226 is located within a range 232 shown in FIG. 4G. Preferably, the edge 234 of the mask layer 226 is located at about the central line of the range 232. This means that the edge 234 of the mask layer 226 need not be precisely aligned over the edge of the buried contact 218. The range 232 indicates the process window of this process. Since the edge 234 of the mask layer 236 need only be located within the range 232, the process window of this process is widened.

Figure 4H:
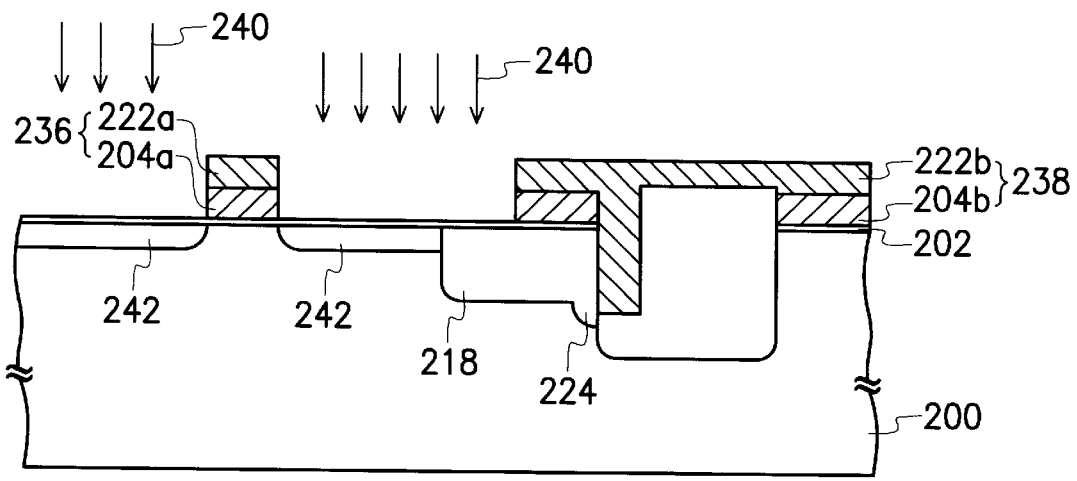

As shown in FIG. 4H, a portion of the conductive layer 222 and a portion of the conductive layer 204 exposed by the mask layer 226 are removed to form a gate 236 and a conductive wire 238 on the buried contact 218 by, for example, an anisotropic etching process. The gate 236 comprises a conductive layer 222a and a conductive layer 204a; the conductive wire 238 comprises a conductive layer 222b and a conductive layer 204b. The mask layer 226 is removed, and then an ion implantation step 240 is performed to form a lightly doped source/drain region 242 in the substrate 200.

Figure 4I:
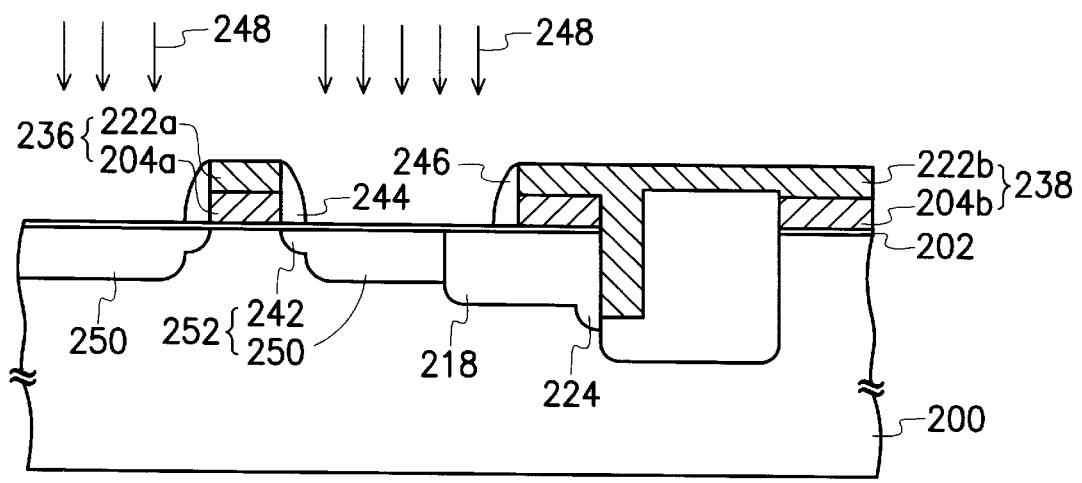

As shown in FIG. 4I, spacers 244 and 246 are respectively formed on sidewalls of the gate 236 and sidewalls of the conductive wire 238. The spacers 244 and 246 are made of a material such as silicon nitride. For example, the formation of the spacers 244 and 246 is described as the following steps. First, a silicon nitride layer (not shown in FIG. 4I) is formed over the substrate 200 by chemical vapor deposition. Then, a portion of the silicon nitride layer is removed to expose the substrate 200 by an etch back process, and the spacers 244 and 246 are formed on the sidewalls of the gate 236 and the sidewalls of the conductive wire 238, respectively. An ion implantation step 248 is performed to form a heavily doped source/drain region 250 in the substrate 200 while using the gate 236, the conductive wire 238 and the spacers 244, 246 as a mask. The lightly doped source/drain region 242 and the heavily doped source/drain region 250 constitute a source/drain region 252.

In the invention, the process window of the process is widened because the edge 234 of the mask layer 226 need only be located within the range 232. Whether a positive offset or a negative offset occurs, the conductive wire 238 can couple with the source/drain region 252 through the buried contact 218. Additionally, the micro-trench formed within the buried contact and electrical discontinuity between the buried contact and the source/drain region are both avoided due to the wide process window.

The conductive wire formed by the method mentioned above couples with both the gate and the source/drain region, so that this invention is suitable for logic circuits and static random access memories (SRAM).

According to the aforementioned description of the embodiment, the advantages of the invention includes:

1. Since the process window of the invention is widened, the process is easily performed, and the throughput of the process is increased.
2. In this invention, the micro-trench formed within the buried contact, and electrical discontinuity between the source/drain region and the buried contact are avoided due to the wide process window.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a buried contact, comprising the steps of:

providing a substrate with an oxide layer and a first conductive layer thereon;

forming an isolation region in the first conductive layer, the oxide layer and the substrate;

forming a patterned first mask layer over the substrate exposing a portion of the isolation region and a portion of the first conductive layer;

performing an ion implantation process to form a buried contact within the substrate while using the patterned first mask layer as a mask;

removing a portion of the isolation region exposed by the patterned first mask layer to form a trench in the isolation region;

removing the first mask layer;

forming a second conductive layer over the substrate to fill the trench; and patterning the second conductive layer and the first conductive layer to form a conductive wire and a gate, wherein the conductive wire electrically connects with the buried contact.

2. The method of claim 1, wherein the step of patterning the second conductive layer and the first conductive layer further comprises:

forming a second mask layer over the substrate, wherein the second mask layer at least covers a portion of the buried contact and a predetermined region for forming a gate;

removing a portion of the second conductive layer and a portion of the first conductive layer, which are exposed by the second mask layer, to form the conductive wire and the gate; and removing the second mask layer.

3. The method of claim 1, wherein the first conductive layer includes doped polysilicon.

4. The method of claim 1, wherein the second conductive layer includes silicide.

5. The method of claim 1, wherein the second conductive layer includes doped polysilicon.

6. The method of claim 5, wherein dopants in the second conductive layer are driven into the substrate to form a diffusion region by a thermal process.

7. The method of claim 1, wherein after patterning the second conductive layer and the first conductive layer, further comprises the steps of:

forming a lightly doped source/drain region within the substrate, wherein the lightly doped source/drain region makes contact with the buried contact;

forming a spacer on sidewalls of the gate; and forming a heavily doped source/drain region within the substrate while using the spacer, the gate and the conductive wire as a mask.

8. A method for forming a buried contact, comprising the steps of:

providing a substrate with an oxide layer, a first conductive layer and a first mask layer formed thereon;

patterning the first mask layer, the first conductive layer and the oxide layer to form a first trench in the substrate;

filling the first trench with an insulating layer;

removing the first mask layer;

forming a second mask layer with an opening over the substrate, wherein a portion of the insulating layer and a portion of the first conductive layer are exposed by the opening;

performing an ion implantation process to form a buried contact within the substrate, with the second mask layer serving as a mask;

removing the portion of the insulating layer exposed by the second mask layer to form a second trench;

removing the second mask layer;

forming a second conductive layer over the substrate to fill the second trench;

forming a third mask layer over the substrate, wherein the third mask layer at least covers a portion of the buried contact and a region predetermined for forming a gate;

removing a portion of the second conductive layer and the first conductive layer exposed by the third mask layer to form a conductive wire and a gate;

removing the third mask layer; and forming a source/drain region in the substrate, wherein the source/drain region couples with the buried contact.

9. The method of claim 8, wherein the first conductive layer includes doped polysilicon.

10. The method of claim 8, wherein the second conductive layer includes silicide.

11. The method of claim 8, wherein the second conductive layer includes doped polysilicon.

12. The method of claim 11, wherein dopants in the second conductive layer are driven into the substrate to form a diffusion region by a thermal process.

13. The method of claim 8, wherein the step of forming the source/drain region further comprises:

forming a lightly doped source/drain region within the substrate, wherein the lightly doped source/drain region connects with the buried contact;

forming a spacer on sidewalls of the gate; and forming a heavily doped source/drain region within the substrate with the spacer, the gate and the conductive wire serving as a mask.

14. The method of claim 8, wherein the first mask layer includes silicon nitride.

* * * * *